United States Patent
Langeveld et al.

(10) Patent No.: US 9,224,573 B2
(45) Date of Patent: *Dec. 29, 2015

(54) SYSTEM AND METHOD FOR X-RAY SOURCE WEIGHT REDUCTION

(75) Inventors: Willem Gerhardus Johannes Langeveld, Menlo Park, CA (US); Tsahi Gozani, Palo Alto, CA (US); Joseph Bendahan, San Jose, CA (US)

(73) Assignee: Rapiscan Systems, Inc., Torrance, CA (US)

( * ) Notice: Subject to any disclaimer, the term of this patent is extended or adjusted under 35 U.S.C. 154(b) by 609 days.

This patent is subject to a terminal disclaimer.

(21) Appl. No.: 13/492,614

(22) Filed: Jun. 8, 2012

(65) Prior Publication Data

US 2012/0321049 A1    Dec. 20, 2012

Related U.S. Application Data

(60) Provisional application No. 61/494,887, filed on Jun. 9, 2011.

(51) Int. Cl.
| | | |
|---|---|---|
| H01J 35/30 | (2006.01) | |
| H01J 35/14 | (2006.01) | |
| H05G 1/52 | (2006.01) | |
| H01J 37/141 | (2006.01) | |
| H01J 37/147 | (2006.01) | |
| G21K 1/093 | (2006.01) | |
| H01J 35/08 | (2006.01) | |

(52) U.S. Cl.
CPC .................. *H01J 35/30* (2013.01); *H01J 35/14* (2013.01); *H05G 1/52* (2013.01); *G21K 1/093* (2013.01); *H01J 35/08* (2013.01); *H01J 37/141* (2013.01); *H01J 37/1475* (2013.01); *H01J 2235/081* (2013.01); *H01J 2235/086* (2013.01)

(58) Field of Classification Search
CPC .......... H01J 35/14; H01J 35/30; H01J 37/06; H01J 37/14; H01J 37/141; H01J 37/143; H01J 37/147; H01J 37/1472; H01J 37/1474; H01J 37/1475; H05G 1/52; G21K 1/08; G21K 1/093
USPC .......... 378/62, 106, 113–116, 119, 121, 136, 378/137, 145, 146, 204, 210; 250/370.09, 250/396 R, 397, 398, 396 ML, 427, 493.1, 250/503.1, 505.1, 526

See application file for complete search history.

(56) References Cited

U.S. PATENT DOCUMENTS

| | | | |
|---|---|---|---|
| 2,420,845 | A | 5/1947 | Slack |
| 2,885,069 | A | 5/1959 | Bowen |

(Continued)

FOREIGN PATENT DOCUMENTS

| | | | |
|---|---|---|---|
| CA | 2624658 | A1 | 9/2009 |
| CA | 2624663 | A1 | 9/2009 |

(Continued)

OTHER PUBLICATIONS

International Search Report for PCT/US12/41696, Rapiscan Systems Inc., mailed on Sep. 18, 2012.

(Continued)

*Primary Examiner* — Anastasia Midkiff
(74) *Attorney, Agent, or Firm* — Novel IP

(57) ABSTRACT

The invention provides an X-ray source having a generator for generating an electron beam, an accelerator for accelerating the generated electron beam in a desired direction, one or more magnetic elements for transporting portions of the electron beam in a more than one desired direction, and a shaped target made from a material having an atomic number lying within a predetermined range of values, the transported parts of the electron beam producing a fan beam of X rays upon striking the shaped target.

17 Claims, 2 Drawing Sheets

(56) References Cited

U.S. PATENT DOCUMENTS

| | | |
|---|---|---|
| 3,070,399 A | 12/1962 | Bartlett |
| 3,417,243 A | 12/1968 | Hill |
| 3,439,166 A | 4/1969 | Chope |
| 3,919,467 A | 11/1975 | Peugeot |
| 4,020,346 A | 4/1977 | Dennis |
| 4,254,599 A | 3/1981 | Maistre |
| 4,366,382 A | 12/1982 | Kotowski |
| 4,434,372 A * | 2/1984 | Cleland ......................... 250/400 |
| 4,481,403 A | 11/1984 | Del |
| 4,719,153 A | 1/1988 | Akasawa |
| 4,831,260 A | 5/1989 | DiBianca |
| 4,879,735 A | 11/1989 | Owens |
| 4,884,289 A | 11/1989 | Glockmann |
| 4,998,270 A | 3/1991 | Scheid |
| 5,040,199 A | 8/1991 | Stein |
| 5,046,846 A | 9/1991 | Ray |
| 5,065,418 A | 11/1991 | Bermbach |
| 5,259,012 A * | 11/1993 | Baker et al. ..................... 378/21 |
| 5,260,983 A | 11/1993 | Ono |
| 5,319,696 A | 6/1994 | Abdel-Malek |
| 5,321,271 A | 6/1994 | Schonberg |
| 5,418,372 A | 5/1995 | Schonberg |
| 5,422,926 A * | 6/1995 | Smith et al. .................... 378/121 |
| 5,428,657 A | 6/1995 | Papanicolopoulos |
| 5,491,734 A * | 2/1996 | Boyd et al. ...................... 378/10 |
| 5,600,700 A | 2/1997 | Krug |
| 5,638,420 A | 6/1997 | Armistead |
| 5,661,377 A | 8/1997 | Mishin |
| 5,838,758 A | 11/1998 | Krug |
| 5,838,759 A | 11/1998 | Armistead |
| 5,909,478 A | 6/1999 | Polichar |
| 5,949,811 A | 9/1999 | Baba |
| 5,958,299 A | 9/1999 | Kury |
| 5,970,113 A | 10/1999 | Crawford |
| 5,974,111 A | 10/1999 | Krug |
| 6,069,936 A | 5/2000 | Bjorkholm |
| 6,118,850 A | 9/2000 | Mayo |
| 6,134,299 A | 10/2000 | Artig |
| 6,304,629 B1 | 10/2001 | Conway |
| 6,327,339 B1 | 12/2001 | Chung |
| 6,347,132 B1 | 2/2002 | Annis |
| 6,438,201 B1 | 8/2002 | Mazess |
| 6,442,233 B1 | 8/2002 | Grodzins |
| 6,459,761 B1 | 10/2002 | Grodzins |
| 6,556,653 B2 | 4/2003 | Hussein |
| 6,567,496 B1 | 5/2003 | Sychev |
| 6,632,020 B2 | 10/2003 | Kaufhold |
| 6,713,773 B1 * | 3/2004 | Lyons et al. ................. 250/492.3 |
| 6,763,083 B2 | 7/2004 | Fernandez |
| 6,785,357 B2 | 8/2004 | Bernardi |
| 6,847,040 B2 | 1/2005 | Strommer |
| 6,973,158 B2 | 12/2005 | Besson |
| 6,987,833 B2 | 1/2006 | Du |
| 7,010,094 B2 | 3/2006 | Grodzins |
| 7,020,242 B2 | 3/2006 | Ellenbogen |
| 7,103,137 B2 | 9/2006 | Seppi |
| 7,130,484 B2 | 10/2006 | August |
| 7,233,644 B1 * | 6/2007 | Bendahan et al. ............... 378/57 |
| 7,257,189 B2 | 8/2007 | Modica |
| 7,272,208 B2 | 9/2007 | Yatsenko |
| 7,286,638 B2 | 10/2007 | Ledoux |
| 7,322,745 B2 | 1/2008 | Agrawal |
| 7,366,282 B2 | 4/2008 | Peschmann |
| 7,368,717 B2 | 5/2008 | Verbinski |
| 7,369,642 B2 | 5/2008 | Eilbert |
| 7,372,944 B2 | 5/2008 | Bernhardt |
| 7,381,962 B2 | 6/2008 | Goldberg |
| 7,406,192 B2 | 7/2008 | Schmiegel |
| 7,440,544 B2 | 10/2008 | Scheinman |
| 7,453,987 B1 | 11/2008 | Richardson |
| 7,471,764 B2 | 12/2008 | Kaval |
| 7,483,511 B2 | 1/2009 | Bendahan |
| 7,492,682 B2 | 2/2009 | Osakabe |
| 7,492,862 B2 | 2/2009 | Bendahan |
| 7,492,934 B2 | 2/2009 | Mundy |
| 7,512,210 B2 | 3/2009 | Possin |
| 7,522,696 B2 | 4/2009 | Imai |
| 7,526,064 B2 | 4/2009 | Akery |
| 7,538,325 B2 | 5/2009 | Mishin |
| 7,555,099 B2 | 6/2009 | Rothschild |
| 7,653,545 B1 | 1/2010 | Starkie |
| 7,693,261 B2 | 4/2010 | Robinson |
| 7,702,075 B2 | 4/2010 | Wang |
| 7,750,294 B2 | 7/2010 | Bright |
| 7,783,005 B2 | 8/2010 | Kaval |
| 7,809,103 B2 | 10/2010 | Du |
| 7,809,104 B2 | 10/2010 | Foland |
| 7,844,027 B2 | 11/2010 | Harding |
| 7,920,735 B2 | 4/2011 | Krauss |
| 7,965,816 B2 | 6/2011 | Kravis |
| 8,054,937 B2 | 11/2011 | Langeveld |
| 8,054,938 B2 | 11/2011 | Kaval |
| 8,111,889 B2 | 2/2012 | Basu |
| 8,116,428 B2 | 2/2012 | Gudmundson |
| 8,121,258 B2 * | 2/2012 | Hoghoj et al. ................. 378/125 |
| 8,179,597 B2 | 5/2012 | Namba |
| 8,233,586 B1 | 7/2012 | Boas |
| 8,437,448 B2 | 5/2013 | Langeveld |
| 8,724,774 B2 | 5/2014 | Langeveld |
| 8,750,452 B2 | 6/2014 | Kaval |
| 8,781,067 B2 | 7/2014 | Langeveld |
| 2003/0035510 A1 | 2/2003 | Strommer |
| 2003/0072417 A1 | 4/2003 | Kaufhold |
| 2003/0118246 A1 | 6/2003 | August |
| 2004/0017888 A1 | 1/2004 | Seppi |
| 2004/0062346 A1 | 4/2004 | Fernandez |
| 2004/0267114 A1 | 12/2004 | Mundy |
| 2005/0008120 A1 | 1/2005 | Ellenbogen |
| 2005/0117683 A1 | 6/2005 | Mishin |
| 2005/0117700 A1 | 6/2005 | Peschmann |
| 2005/0123101 A1 | 6/2005 | Akutsu |
| 2005/0152504 A1 | 7/2005 | Shih |
| 2005/0226484 A1 | 10/2005 | Basu |
| 2006/0182221 A1 | 8/2006 | Bernhardt |
| 2006/0215811 A1 | 9/2006 | Modica |
| 2006/0249685 A1 * | 11/2006 | Tanaka ......................... 250/397 |
| 2007/0092066 A1 | 4/2007 | Tkaczyk |
| 2007/0104320 A1 | 5/2007 | Arenson |
| 2007/0147585 A1 | 6/2007 | Eilbert |
| 2007/0211851 A1 | 9/2007 | Ogawa |
| 2007/0286329 A1 | 12/2007 | Wang |
| 2008/0013672 A1 | 1/2008 | Krauss |
| 2008/0037707 A1 | 2/2008 | Rothschild |
| 2008/0056608 A1 | 3/2008 | Spahn |
| 2008/0170655 A1 | 7/2008 | Bendahan |
| 2008/0198970 A1 | 8/2008 | Kirshner |
| 2008/0211431 A1 | 9/2008 | Mishin |
| 2008/0240341 A1 | 10/2008 | Possin |
| 2008/0283761 A1 | 11/2008 | Robinson |
| 2008/0298546 A1 | 12/2008 | Bueno |
| 2009/0041197 A1 | 2/2009 | Clayton |
| 2009/0086314 A1 | 4/2009 | Namba |
| 2010/0002834 A1 | 1/2010 | Gudmundson |
| 2010/0020937 A1 * | 1/2010 | Hautmann et al. ............ 378/137 |
| 2010/0034353 A1 | 2/2010 | Kravis |
| 2010/0034355 A1 | 2/2010 | Langeveld |
| 2010/0295689 A1 | 11/2010 | Armistead |
| 2011/0096906 A1 | 4/2011 | Langeveld |
| 2011/0235777 A1 | 9/2011 | Gozani |
| 2011/0305318 A1 | 12/2011 | Robinson |
| 2012/0116720 A1 | 5/2012 | Klann |

FOREIGN PATENT DOCUMENTS

| | | |
|---|---|---|
| CA | 2636306 A1 | 9/2009 |
| EP | 0146992 A1 | 7/1985 |
| EP | 0417965 | 3/1991 |
| GB | 516517 A | 1/1940 |
| GB | 10017382 | 2/2010 |
| WO | 9909400 | 2/1999 |
| WO | 0033060 A2 | 6/2000 |
| WO | 0159485 | 8/2001 |
| WO | 0159485 A1 | 8/2001 |
| WO | 2005084351 | 9/2005 |

(56) References Cited

FOREIGN PATENT DOCUMENTS

| WO | 2006000020 A1 | 1/2006 |
|---|---|---|
| WO | 2006053279 A2 | 5/2006 |
| WO | 2009000020 A1 | 12/2008 |
| WO | 2009027667 A2 | 3/2009 |
| WO | 2009137698 | 12/2009 |
| WO | 2010019311 | 2/2010 |
| WO | 2011017475 | 2/2011 |
| WO | 2011095810 | 8/2011 |
| WO | 2011095942 A2 | 8/2011 |
| WO | 2011106463 A1 | 9/2011 |
| WO | 2011142768 A2 | 11/2011 |
| WO | 2012170914 A1 | 12/2012 |
| WO | 2014124152 A2 | 8/2014 |

OTHER PUBLICATIONS

International Search Report for PCT/US09/47292, mailed on Apr 23, 2012, Rapiscan Laboratories, Inc.

International Search Report for PCT/GB2011/050182, mailed on Dec. 28, 2011, Rapiscan Systems Inc.

Office Action dated Nov. 5, 2014 for U.S. Appl. No. 13/577,170.

International Search Report for PCT/US10/35048; Rapiscan Security Products, Inc.; Feb. 8, 2012.

International Search Report for PCT/US2014/015126, May 27, 2014.

Written Opinion of the International Searching Authority for PCT/US2014/015126, May 27, 2014.

International Search Report for PCT/US2010/044475, mailed on Oct. 29, 2010, Rapiscan Laboratories Inc.

Supplementary Partial European Search Report for EP2462431, Nov. 17, 2014.

International Search Report PCT/US2011/025969, mailed on Aug. 1, 2011, Rapiscan Systems Inc.

Final Office Action for Japanese Application No. 2011523012, mailing date Jun. 19, 2014.

* cited by examiner

SYSTEM AND METHOD FOR X-RAY SOURCE WEIGHT REDUCTION

CROSS-REFERENCE TO RELATED APPLICATIONS

The present invention relies on U.S. Provisional Patent Application No. 61/494,887, of the same title, and filed on Jun. 9, 2011, for priority and is incorporated herein by reference in its entirety.

FIELD

The present specification relates generally to the field of radiological inspection systems and more specifically to systems and methods of reducing x-ray source shielding requirements, thereby reducing the overall weight of a linear accelerator x-ray source.

BACKGROUND

X-ray inspection systems include an X-ray generator which typically comprises a heated cathode filament emitting an electron beam. The emitted electrons are accelerated towards a target. The electron beam strikes the target at a focal spot and some portion of the kinetic energy contained in the electron beam is converted into X-ray photons. At the focal spot, the photons are emitted in all directions from the target surface, whereby the intensity and energy of X-rays varies based on the angle with respect to the electron beam direction. The generated X-rays are allowed to leave a heavily shielded area only in a predefined direction.

Current x-ray inspection systems are very heavy, largely due to the massive amounts of shielding required to remove the X-rays produced in all directions from the target surface, except for those in the forward direction where the X-rays are used for radiography or other purposes. The problem is exacerbated by the use of electron targets made of materials having a high atomic number (high-Z). In contrast, low atomic number (low-Z) targets have a much more forward-peaked angular distribution, making it possible to eliminate a lot of lateral shielding. However, when large areas such as in mobile cargo radiography, need to be scanned, the x-rays from low-Z targets typically do not cover the usually vertical extent of the object very well because of this forward-peaked angular distribution.

In addition, mobile cargo inspection systems in particular, require an x-ray source optimized for weight and performance. Currently, weight is primarily determined by the required quantity of shielding materials.

Hence, there is requirement for a system and method to reduce shielding requirements, thereby reducing the overall weight of an x-ray source employed in an x-ray inspection system such as a mobile cargo inspection system.

What is also needed are methods of using magnetic and shaping techniques for low-Z targets that allow for the use of reduced shielding requirements and therefore, a system having an overall lower weight and improved coverage of the object using such low-Z targets.

SUMMARY

In one embodiment, the present invention is an x-ray source comprising an electron beam generator for generating a beam of electrons; an accelerator for accelerating the generated electron beam in a desired direction; and one or more magnetic elements for transporting parts of the accelerated electron beam.

Further, in one embodiment, the present invention comprises a shaped target made from a material having an atomic number lying within a predetermined range of values, the transported parts of the electron beam producing a fan beam of X-rays upon striking the shaped target.

In one embodiment, the magnetic elements comprise a defocusing magnet, such as, but not limited to, a quadrupole magnet, which takes a plurality of parts of the original electron beam and transports them to a corresponding plurality of areas within a shaped magnetic field that in turn transports said parts of the electron beam onto a corresponding plurality of parts of the shaped target, in such a way that said parts of the electron beam impinge on the target in a plurality of directions, optimized for producing x-rays in the desired directions.

In another embodiment, the magnetic elements comprise a bending magnet which can be set to bend the electron beam towards at least one of a plurality of areas within a shaped magnetic field that in turn transports the electron beam onto a corresponding plurality of parts of the shaped target, arriving there in a corresponding plurality of particular directions optimized for producing x-rays in the desired directions. In one embodiment, the bending magnet is set to bend the electron beam towards one of said plurality of areas within the shaped magnetic field on each subsequent accelerator pulse, in a sequence that comprises each of said plurality of areas. Between pulses the bending magnet field strength is adjusted appropriately in order for the beam to be directed towards the next area of the shaped magnetic field in the sequence, as desired.

In one embodiment, the shaped target is made from a material having a low atomic number. In one embodiment, the shaped target is fabricated from industrial diamond. In one embodiment, the shaped target has a semicircular shape.

In one embodiment, the x-rays produced are forward-peaked, thereby reducing the amount of lateral shielding required to prevent the X-rays from escaping in an undesired direction.

In one embodiment, the x-rays produced are forward-peaked, thereby reducing the intensity and energy of the x-rays emerging in lateral directions, thereby reducing the probability of freeing neutrons from the shielding material. These neutrons are a nuisance in that they can produce spurious signals in nearby detectors, and using this method reduces the occurrence of such spurious signals.

In one embodiment, the shaped magnetic field is arranged to transport the electron beam or parts thereof onto the shaped target in such a way that the x-rays will all appear as if they come from within a short distance of a particular point within the target. In another embodiment, the x-rays from different pulses of the x-ray source are transported by the shaped magnetic field to different areas on the target, such that the x-rays appear as if they come from different points within the target. In the latter embodiment, a plurality of separate images can be produced, each from a separate vantage point. In the case where the system is applied in a radiography configuration, the separate images can then be used to obtain 3D information about the object being scanned, as is known to those skilled in the art.

In various embodiments, the coverage of the object being scanned is more uniform in both X-ray intensity and X-ray energy than in conventional systems. This allows a reduction in source intensity, since the source intensity is, in part, determined by the required X-ray coverage at angles other than the forward direction.

The aforementioned and other embodiments of the present shall be described in greater depth in the drawings and detailed description provided below.

BRIEF DESCRIPTION OF THE DRAWINGS

These and other features and advantages of the present invention will be appreciated, as they become better understood by reference to the following detailed description when considered in connection with the accompanying drawings.

DETAILED DESCRIPTION

The present specification is directed towards an x-ray inspection system employing a low-Z x-ray target, such as graphite, in order to reduce shielding requirements and thereby reduce the overall weight of a linear accelerator x-ray source employed in the inspection system. Since X-rays generated from a low-Z target are forward-peaked, they allow for a significant reduction in lateral and backward shielding, and, as a result, a significant reduction in overall shielding weight can be achieved. The amount of weight reduction depends on factors such as the electron beam energy, the geometrical configuration of the accelerator components and the shielding material used, but is on the order of several hundred pounds at a minimum for electron beam energies of 5 MV and above. In one embodiment, the present specification provides an x-ray source design having significant weight reduction and performance improvement. In one embodiment, the x-ray source system and methods of the present invention are used in mobile cargo inspection systems. In other embodiments, the x-ray source system and methods are used in any radiological application, where reduced shielding and overall weight is desired.

As is known to those of ordinary skill in the art, X-rays produced by a 5 MeV to 9 MeV electron beam on a low-Z target have a steeper angular distribution with respect to the forward direction than the X-rays produced on traditional high-Z targets like tungsten. The x-ray inspection system of the present specification employs a low-Z target for reducing lateral shielding requirements. The system of the present specification compensates for the steeper angular distribution by use of magnetic beam transport and shaping of the low-Z target, thereby producing a more uniform coverage of the object being scanned than conventional systems with respect to both x-ray intensity and x-ray energy.

The present specification is directed towards multiple embodiments. The following disclosure is provided in order to enable a person having ordinary skill in the art to practice the invention. Language used in this specification should not be interpreted as a general disavowal of any one specific embodiment or used to limit the claims beyond the meaning of the terms used therein. The general principles defined herein may be applied to other embodiments and applications without departing from the spirit and scope of the invention. Also, the terminology and phraseology used is for the purpose of describing exemplary embodiments and should not be considered limiting. Thus, the present invention is to be accorded the widest scope encompassing numerous alternatives, modifications and equivalents consistent with the principles and features disclosed. For purpose of clarity, details relating to technical material that is known in the technical fields related to the invention have not been described in detail so as not to unnecessarily obscure the present invention.

Figure 1:
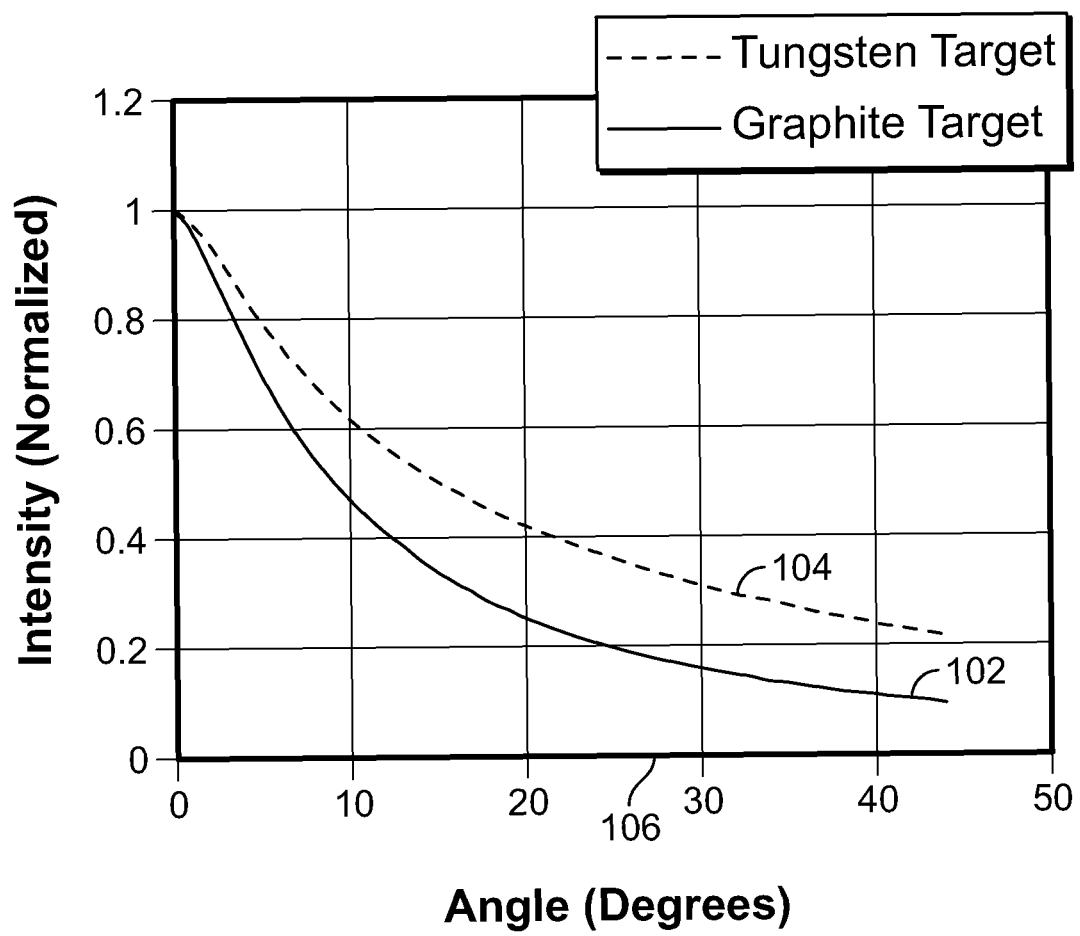
FIG. 1 is a graph depicting the intensity of an x-ray source vs. the x-ray source angle corresponding to two similar x-ray sources coupled with a) a low-Z (graphite) target and b) a high-Z (tungsten) target.

FIG. 1 is a graph depicting the intensity of an x-ray source vs. the x-ray source angle corresponding to two similar x-ray sources coupled with a) a low-Z (graphite) target and b) a high-Z (tungsten) target. FIG. 1 shows X-ray angular distributions 102, 104 with respect to the electron beam direction in an X-ray inspection system, for two radiation sources, simulated using the EGS electron-photon transport code. EGS is a standard simulation code. It should be noted herein that other simulation codes would yield similar results. The sources simulated here are standard 9 MV sources in which electron beams strike a target. The energy of the source does affect the overall shape, however, it does not affect the fact that a low-Z target has a steeper angular fall-off than a high-Z target.

One of the sources is coupled with a high-Z target, such as tungsten, which has an atomic number of 74 (Z=74), while the second source is coupled with a low-Z target, such as graphite, which has an atomic number of (Z=6).

During simulation internal tungsten shielding is provided in a backward direction. While x-ray intensity distributions obtained are averaged over all the x-ray energies, the angular distribution is steeper for the higher energy X-rays than for the lower energy X-rays. As is illustrated in FIG. 1, at an angle 106 of approximately 30 degrees (as shown on the x-axis), the intensity 102 of the x-ray source coupled with the tungsten target is lower than the intensity 104 of the x-ray source coupled with the graphite target by a factor of two. Thus, as illustrated, significant amounts of shielding material may be eliminated by using a low-Z target such as graphite instead of a high-Z target like tungsten in an x-ray inspection system. Since such shielding is usually in the form of lead, and since the shielding can be removed from the outer layers when a low-Z target is used, this adds up to a significant shielding volume and therefore weight. By way of an example estimate, it is calculated that at a minimum, a layer of one half inch (about one half-value layer) of lead at a radius of 25 cm with a weight of approximately 200 pounds can be omitted by using a low-Z target. In reality, typical shielding designs are much more complicated, in part because of the geometry of the linear accelerator components and in part because of the change of the energy spectrum with angle, and a larger amount of excess shielding could most likely be removed. Thus, it should be noted that the example provided above is only for exemplary purposes and in no way limiting to the present invention.

High-Z targets provide a more uniform intensity of an x-ray fan beam which is typically used in cargo radiography systems, as compared to low-Z targets. In general, angular coverage is approximately a factor of two lower for a low-Z target than a high-Z target. Typically, angular coverage of an X-ray beam in a standard cargo radiography system is around 70 degrees (35 degrees in each direction as measured from where the beam exits the x-ray source) which is typically obtained by using a high-Z tungsten target. It should be noted that this coverage is still not very uniform, however. For example, at 35 degrees, the intensity is only 30% of the forward intensity (for a 9 MV source). When a low-Z target is employed, the equivalent angular coverage is approximately 34 degrees (17 degrees in either direction). Generally, angular coverage is even lower considering the energy spectrum of the x-rays at such angles; for example, lower-Z targets have a faster fall-off of high-energy x-rays, and thus have less coverage for the high energy x-rays which are more useful for radiography. On the other hand, however, this makes sources with low-Z targets easier to shield.

In one embodiment of the present invention, the electron beam in an x-ray generator tube is directed onto a custom target in a manner that produces "forward radiation" at a number of different angles, thereby making it possible to achieve better angular coverage than a high-Z target, and only in the desired directions. Forward radiation, or forward peaked radiation, is radiation that is preferentially emitted in the same direction as the electron beam direction when the latter strikes the target. More forward peaked radiation is radiation that is concentrated in a smaller range of angles with respect to the electron beam direction. Referring to FIG. 1, for a high-Z target (tungsten) the intensity of the radiation averaged over all energies drops to half of its 0-degree value at an angle of about 15 degrees. For the low-Z target (graphite), the intensity of the radiation drops off to half of its 0-degree value at about 9 degrees. Therefore, for a low-Z target, the intensity of the radiation drops off to half of its 0-degree value at a smaller angle range than for a high-Z target. Also, for a low Z target, the forward peak nature of the emission is indicative of having at least 50 percent of the intensity of the total radiation concentrated in angles less than 10 degrees from the emission point. It should be appreciated that shielding can be decreased in areas beyond a particular angle, as measured from the emission point, where the intensity has sufficiently decreased, such as beyond 9, 10, 11, 12, 13, or 14 degrees, relative to the shielding between the particular angle and emission point.

It should be appreciated that a low-Z target is an electron beam target comprising materials with an atomic number, Z, which is less than that of iron, e.g. 26. A high-Z target is an electron beam target comprising materials with an atomic number, Z, above that of tin, e.g. 50. For example, graphite and diamond (carbon) have a Z of 6 while tungsten has a Z of 74.

In one embodiment, the magnetic elements comprise a defocusing magnet, such as, but not limited to, a quadrupole magnet. Defocusing magnet applies a magnetic field to an electron beam which causes portions of the electron beam to diverge from each other. Depending on the target configuration, those diverging portions may then impinge different locations on the shaped target. For example, for a small shaped diamond target, the diverging beam is then refocused using an appropriately shaped magnetic field. However, for a semi-circular target, the beam may remain defocused. Regardless, in this way, the parts of the electron beam impinge on the target in a manner that is optimized for producing x rays in the desired directions.

Figure 2:
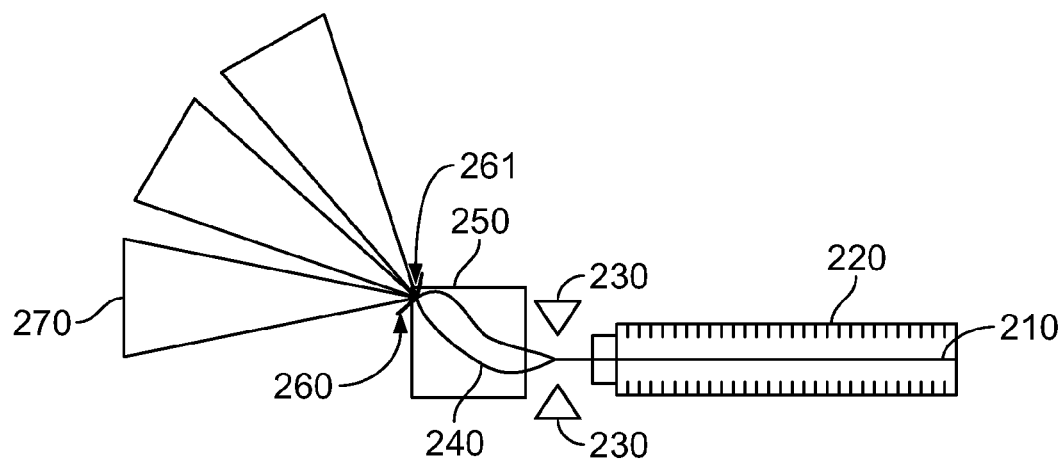
FIG. 2 illustrates an x-ray fan beam generated by using a custom low-Z target, in accordance with an embodiment of the present invention, in which the magnetic elements comprise a defocusing magnet.

FIG. 2 illustrates an x-ray fan beam generated by using a custom low-Z target, in accordance with an embodiment of the present invention in which the magnetic elements comprise a defocusing magnet. As shown in FIG. 2, electron beam 210, after passing through accelerator 220, is transported in a partially vertical direction by using magnetic elements 230. In one embodiment, magnetic elements 230 comprise defocusing quadrupole magnets. The transported beam 240 enters a shaped magnetic field 250, designed to transport different parts of the beam 240 to different areas on a shaped target 260 to produce x-ray fan beam 270. The geometry is optimized in order to provide a reasonable virtual focal point 261 for the produced x-rays 270. Thus, in one embodiment, the shaped magnetic field is arranged to transport the electron beam or parts thereof onto the shaped target in such a way that the x-rays will all appear as if they come from within a short distance of a particular point within the target.

In one embodiment, the shaped magnetic field is created by optimally arranging magnetic materials and electric coils, as is known to those of ordinary skill in the art. The magnetic field and target geometry are optimized to make as small a beam spot as possible. Both geometries are preferably optimized. In this embodiment, the main characteristic is to make it appear as though the x-rays all come from the same spot.

In one embodiment, the shaped target is made from a material having a low atomic number. In one embodiment, the shaped target is fabricated from industrial diamond. In one embodiment, the shaped target has a semicircular shape.

In one embodiment, the x-rays produced are forward-peaked, thereby reducing the amount of lateral shielding required to prevent the X-rays from escaping in an undesired direction.

In one embodiment, the x-rays produced are forward-peaked, thereby reducing the intensity and energy of the x-rays emerging in lateral directions, thereby reducing the probability of freeing neutrons from the shielding material. These neutrons are a nuisance in that they can produce spurious signals in nearby detectors, and using this method reduces the occurrence of such spurious signals. Further, in using the method of the present invention, the thickness of materials needed to shield against these neutrons can be reduced. Alternatively, other shielding materials and geometries can be used than might otherwise be the case.

In another embodiment, the magnetic elements comprise a bending magnet which can be set to bend the electron beam towards at least one of a plurality of areas within a shaped magnetic field that in turn transports the electron beam onto a corresponding plurality of parts of the shaped target, arriving there in a corresponding plurality of particular directions optimized for producing x-rays in the desired directions. In one embodiment, the bending magnet is set to bend the electron beam towards one of said plurality of areas within the shaped magnetic field on each subsequent accelerator pulse, in a sequence that comprises each of said plurality of areas. Between pulses the bending magnet field strength is adjusted appropriately in order for the beam to be directed towards the next area of the shaped magnetic field in the sequence, as desired.

Figure 3:
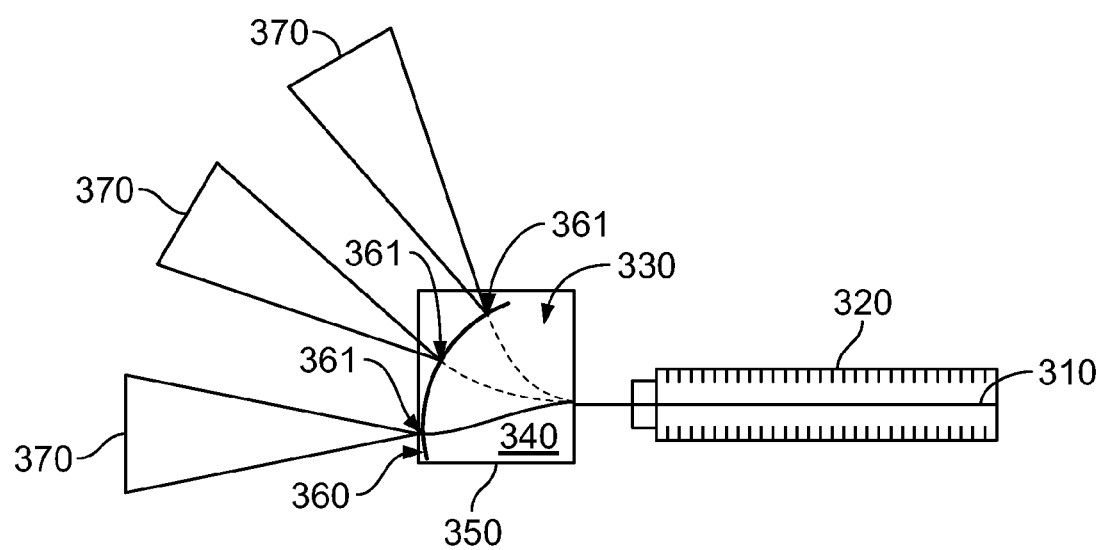
FIG. 3 illustrates an x-ray fan beam generated by using a custom low-Z target, in accordance with an embodiment of the present invention, in which the magnetic elements comprise a bending magnet.

FIG. 3 illustrates an x-ray fan beam generated by using a custom low-Z target, in accordance with an embodiment of the present invention, in which the magnetic elements comprise a bending magnet. As shown in FIG. 3, electron beam 310, after passing through accelerator 320, is transported in a vertical direction by using magnetic elements 330. In one embodiment, magnetic elements 330 comprise a bending magnet that is set to bend the electron beam on each subsequent accelerator pulse, thus creating a switching magnetic field. The transported beam 340 enters a shaped magnetic field 350, designed to transport different parts of the beam 340 to different areas on a shaped target 360 to produce X-ray fan beam 370. The x-rays from different pulses of the x-ray source are transported by the shaped magnetic field 350 to different areas on the shaped target 360, such that the x-rays appear as if they come from different points (x-ray spots) 361 within the target. Therefore, the electron beam in an X-ray generator is switched from one direction on a target to another in successive electron pulses, in order to generate X-rays having a uniform intensity.

By transporting the x-rays from different pulses of the x-ray source by the shaped magnetic field to different areas on the target, such that the x-rays appear as if they come from different points within the target, a plurality of separate images can be produced, each from a separate vantage point. In the case where the system is applied in a radiography configuration, the separate images can then be used to obtain 3D information about the object being scanned, as is known to those skilled in the art.

The above examples are merely illustrative of the many applications of the system of present invention. Although only a few embodiments of the present invention have been described herein, it should be understood that the present invention might be embodied in many other specific forms without departing from the spirit or scope of the invention. Therefore, the present examples and embodiments are to be considered as illustrative and not restrictive, and the invention may be modified within the scope of the appended claims.

We claim:

1. An X-ray source comprising:
   a generator for generating an electron beam;
   an accelerator for accelerating the generated electron beam in a desired direction;
   one or more magnetic elements for directing a first part of the electron beam in a first direction and a second part of the electron beam in a second direction, wherein the first and second direction are different, wherein the one or more magnetic elements comprise a bending magnet adapted to transport a first part of the electron beam to a first predefined area within a shaped magnetic field on a first pulse of the electron beam and a second part of the electron beam to a second predefined area within the shaped magnetic field on a second pulse of the electron beam; and
   a shaped target made from a low Z material, wherein the directed parts of the electron beam produce a fan beam of X-rays upon striking the target.

2. The X-ray source as claimed in claim 1 wherein a steep angular distribution of X rays produced by the target is compensated by the magnetic direction of the electron beam and a shape of the target, thereby causing the X-rays produced to provide a wide coverage of an object being scanned.

3. The X-ray source as claimed in claim 1 wherein the directed parts of the electron beam produce forward radiation at a plurality of different angles upon striking the shaped target, thereby providing a wide angular coverage of an object being scanned only in one or more desired directions.

4. The X-ray source as claimed in claim 1 wherein the directed parts of the electron beam produce X-rays having a wide angular coverage of an object being scanned only in one or more desired directions, thereby reducing X-ray shielding requirement in one or more undesired directions.

5. The X-ray source as claimed in claim 1 wherein the directed parts of the electron beam produce X-rays for covering an object being scanned with uniform intensity and energy.

6. The X-ray source as claimed in claim 1 wherein, the magnetic elements comprise a defocusing magnet for transporting at least a part of the electron beam to a predefined area within a shaped magnetic field, the shaped magnetic field directing the part of the electron beam onto a predefined part of the shaped target, thereby causing production of X rays in a desired direction.

7. The X-ray source as claimed in claim 1 wherein the magnetic elements comprise one or more quadrupole magnets for directing at least a part of the electron beam to a predefined area within a shaped magnetic field, the shaped magnetic field directing the part of the electron beam onto a predefined part of the shaped target, thereby causing production of X-rays in a desired direction.

8. The X-ray source as claimed in claim 1 wherein the magnetic elements comprise a bending magnet for transporting at least a part of the electron beam to a predefined area within a shaped magnetic field, the shaped magnetic field directing the part of the electron beam onto a predefined part of the shaped target, thereby causing production of X-rays in a desired direction.

9. The X-ray source as claimed in claim 1 wherein, the shaped target comprises graphite.

10. The X-ray source as claimed in claim 1 wherein, the shaped target has a semi-circular shape.

11. The X-ray source as claimed in claim 1 wherein, the produced fan beam of X rays are forward-peaked, thereby reducing an amount of lateral shielding required to prevent the X rays from escaping in an undesired direction.

12. The X-ray source as claimed in claim 6 wherein the shaped magnetic field is arranged to direct one or more parts of the electron beam onto the shaped target causing the generated X-rays to appear as originating from within a predefined distance of a predefined point within the shaped target.

13. The X-ray source as claimed in claim 6 wherein the shaped magnetic field is arranged to direct a plurality of parts of the electron beam to different areas on the shaped target, causing the generated X-rays to appear as originating from different points within the shaped target.

14. An X-ray source comprising:
    a generator for generating an electron beam;
    an accelerator for accelerating the generated electron beam in a desired direction;
    one or more magnetic elements for directing at least a part of the electron beam in a desired direction, the magnetic elements comprising a defocusing magnet for directing a first part of the electron beam to a first predefined area within a shaped magnetic field and a second part of the electron beam to a second predefined area within the shaped magnetic field, wherein the first predefined area and second predefined area are different; and
    a shaped target made from a material having a low Z atomic number, wherein the shaped magnetic field is arranged to direct the first part of the electron beam and second part of the electron beam onto the shaped target causing generated X-rays to appear as originating from within a predefined distance of a redefined point within the shaped target.

15. The X-ray source as claimed in claim 14 wherein, the shaped target is made from graphite.

16. The X-ray source as claimed in claim 14 wherein, the shaped target comprises diamond.

17. The X-ray source as claimed in claim 14 wherein, the shaped target has a semi-circular shape.

* * * * *